United States Patent
Apel et al.

(10) Patent No.: US 7,224,230 B2
(45) Date of Patent: May 29, 2007

(54) BIAS CIRCUIT WITH MODE CONTROL AND COMPENSATION FOR VOLTAGE AND TEMPERATURE

(75) Inventors: Thomas R. Apel, Portland, OR (US); Rebouh Benelbar, Murphy, TX (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 15 days.

(21) Appl. No.: 11/065,208

(22) Filed: Feb. 22, 2005

(65) Prior Publication Data
US 2006/0186962 A1    Aug. 24, 2006

(51) Int. Cl.
*H03F 3/04* (2006.01)
(52) U.S. Cl. ............ 330/289; 330/285; 330/296; 330/290
(58) Field of Classification Search ........ 330/289, 330/290, 296, 285
See application file for complete search history.

(56) References Cited

U.S. PATENT DOCUMENTS

| | | | | |
|---|---|---|---|---|
| 5,532,648 A | * | 7/1996 | Culling | 330/289 |
| 5,548,248 A | * | 8/1996 | Wang | 330/288 |
| 5,986,509 A | * | 11/1999 | Lohninger | 330/290 |
| 6,255,897 B1 | * | 7/2001 | Klemmer | 327/538 |
| 6,300,837 B1 | * | 10/2001 | Sowlati et al. | 330/296 |
| 6,369,656 B2 | * | 4/2002 | Dening et al. | 330/296 |

* cited by examiner

*Primary Examiner*—Patricia Nguyen
(74) *Attorney, Agent, or Firm*—Bever Hoffman & Harms

(57) ABSTRACT

An amplifier bias system. The amplifier bias system includes a battery voltage supply coupled with an amplifier transistor to be biased; an output node coupled with a gate of the amplifier transistor; and a current source coupled with the battery voltage supply, wherein the current source provides a current to a node in response to the battery voltage supply. The amplifier bias system further includes a first transistor coupled between the battery voltage supply and the output node, the first transistor having a gate coupled with the first node; a second transistor coupled with the first node, the second transistor having a gate coupled with the output node; and a current load coupled with the output node.

13 Claims, 10 Drawing Sheets

BIAS CIRCUIT WITH MODE CONTROL AND COMPENSATION FOR VOLTAGE AND TEMPERATURE

FIELD OF THE INVENTION

The present invention relates to a circuit for biasing a field effect transistor (FET) in a radio frequency (RF) amplifier device, wherein the circuit is fabricated using a process such as an enhancement/depletion (E/D) pHEMT process or a CMOS process.

BACKGROUND

Linear power amplifiers, such as CDMA or WLAN power amplifiers, typically require a bias reference voltage in order to set the quiescent operating current of the amplifier. Standard practice in bias circuit design is to set a current density in a small transistor and then mirror that current density to a larger RF amplifier transistor.

FIG. 1A is a circuit diagram of a conventional bias circuit 100, which is used to bias an RF amplifier transistor 110 of a linear power amplifier. Bias circuit 100 includes enhancement mode field effect transistors 101–102 and resistor 103, which are connected as illustrated. Bias circuit 100 applies a bias voltage $VGS_{OUT}$ to the gate of RF amplifier transistor 110, thereby causing a quiescent DC bias current $I_B$ to flow through transistor 110.

The drain of transistor 101 and a first terminal of resistor 103 are coupled to receive a regulated voltage $V_{REG}$. The second terminal of resistor 103 is coupled with the gate of transistor 101 and the drain of transistor 102. The source of transistor 102 is grounded. The source of transistor 101 is coupled with the gate of transistor 102 and to the gate of RF amplifier transistor 110.

The regulated voltage $V_{REG}$ causes transistors 101 and 102 to turn on, such that the bias voltage $VGS_{OUT}$ is applied to the gate of transistor 102, and a current $I_A$ flows through transistor 102. Because the bias voltage $VGS_{OUT}$ is also applied to the gate of RF amplifier transistor 110, the current density of current $I_A$ is mirrored to RF amplifier transistor 110, thereby causing quiescent DC bias current $I_B$ to flow through transistor 110. It is understood that the gate of RF amplifier transistor 110 is also coupled to receive an RF input signal (not shown), and the drain of RF amplifier transistor 110 is used to provide an RF output signal (not shown).

Bias circuit 100 exhibits sensitivity to variations in the applied voltage, $V_{REG}$. The regulated voltage $V_{REG}$ is controlled within a predetermined voltage range (e.g., 2.75 to 2.95 Volts for a 2.8 Volt system). Consequently, a precise voltage regulator circuit (not shown) is used to provide the regulated voltage $V_{REG}$. Such a voltage regulator is an additional expense and undesirably adds to the circuit complexity.

Bias circuit 100 also exhibits sensitivity to variations in temperature. As the temperature increases, the bias currents $I_A$ and $I_B$ undesirably decrease, thereby undesirably changing the biasing of RF amplifier transistor 110. Bias circuit 100 also lacks a control interface for changing the quiescent DC bias current $I_B$.

In addition, the drain of RF amplifier transistor 110 is typically coupled to receive a battery voltage $V_{BATT}$, which is not as constant as the regulated voltage $V_{REG}$. Variations in the battery voltage $V_{BATT}$ result in changes in the quiescent DC bias current $I_B$. FIG. 1B is a graph 120 that illustrates the manner in which the quiescent DC bias current $I_B$ changes in response to changes in the battery voltage $V_{BATT}$.

DETAILED DESCRIPTION

Figure 2:
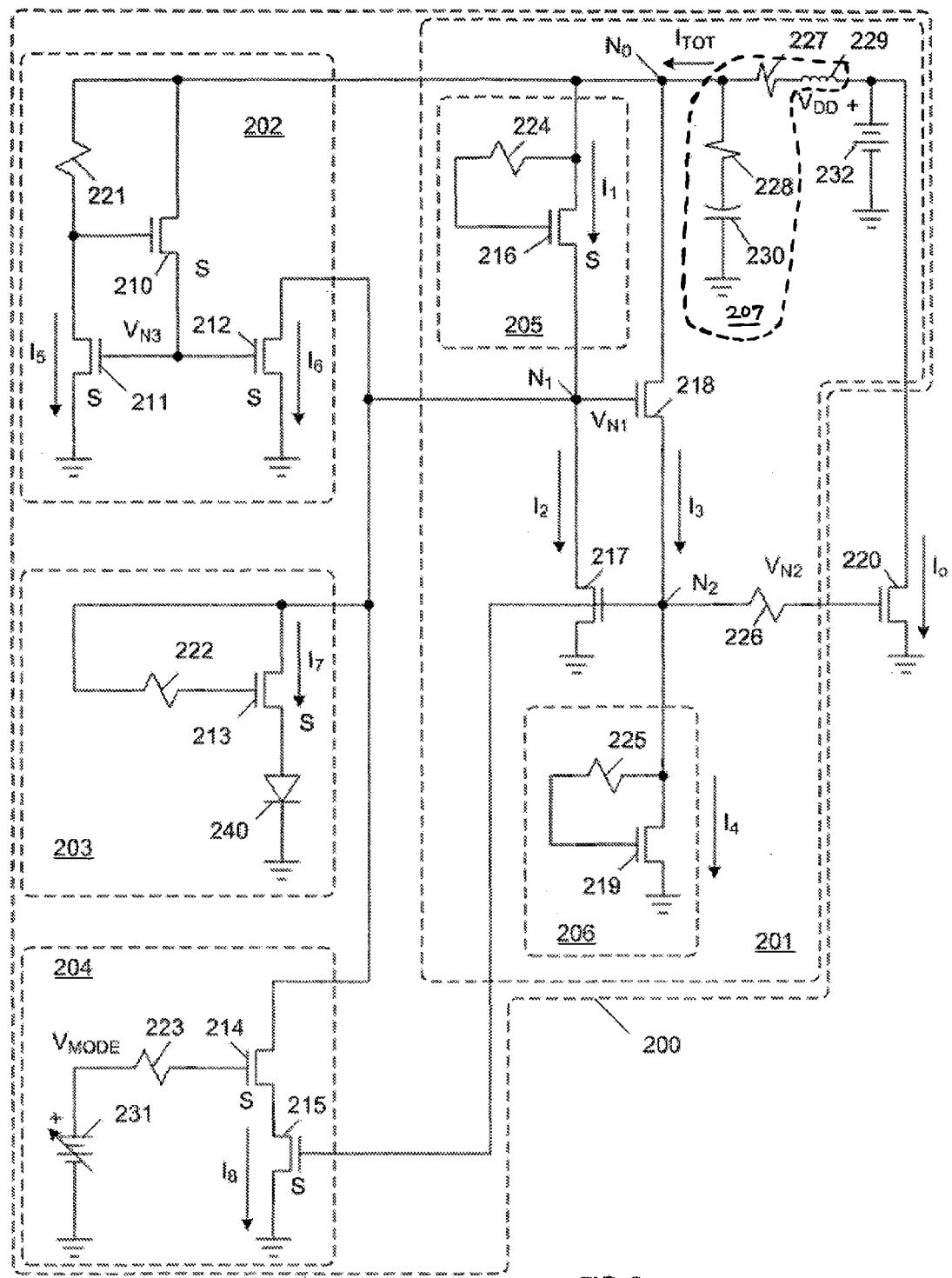
FIG. 2 is a circuit diagram of an FET bias system in accordance with one embodiment of the present invention.

FIG. 2 is a circuit diagram of an FET bias system 200 in accordance with one embodiment of the present invention. Bias system 200 includes bias circuit 201, voltage compensation circuit 202, temperature compensation circuit 203, and mode select circuit 204. More specifically, bias system 200 includes n-channel enhancement mode FETs 210–219, resistors 221–228, inductor 229, capacitor 230, adjustable voltage supply 231, battery voltage supply 232 and diode 240 configured to result in circuits 201–204.

As described in more detail below, bias system 200 includes mode control and compensation for voltage and temperature variations.

Bias system 200 provides bias control voltage $V_{N2}$ to the gate of RF amplifier transistor 220. The drain of RF amplifier transistor 220 is coupled to receive the battery supply voltage $V_{DD}$ provided by battery voltage supply 232. The source of RF amplifier transistor 220 is coupled with ground. In response, a quiescent DC bias current $I_O$ flows through RF amplifier transistor 220.

In the described example, RF amplifier transistor 220 has a gate width of about 7000 microns. An RF input signal (not shown) is applied to the gate of RF amplifier transistor 220 in a manner known to those of ordinary skill in the art. In response, an RF output signal (not shown) is provided at the drain of RF amplifier transistor 220.

Within bias circuit 201, battery voltage supply 232 applies the battery supply voltage $V_{DD}$ to a filter circuit 207 formed by resistors 227–228, inductor 229 and capacitor 230. In the described example, resistors 227 and 228 have typical resistances of about 1 Ohm and 0.1 Ohms, respectively, inductor 229 has an inductance of about 10 nanoHenrys, and capacitor 230 has a capacitance of about 1000 picoFarads. Filter circuit 207 prevents (or may help prevent) the RF output signal provided on the drain of RF amplifier transistor 220 from being transmitted back into bias circuit 201. A current $I_{TOT}$ is provided from filter circuit 207 to node $N_0$. Resistors 227–228 represent practical inter-connects and are not essential to embodiments of the invention. Although embodiments of the invention are described as including resistors 227–228, such embodiments may be practiced without resistors 227–228.

Bias circuit 201 further includes current source 205. Current source 205, which includes resistor 224 and transistor 216, is coupled to receive the battery supply voltage $V_{DD}$ from node $N_0$. More specifically, the first terminal of resistor 224 and the drain of transistor 216 are coupled with node $N_0$. The second terminal of resistor 224 is coupled with the gate of transistor 216. The source of transistor 216 is coupled with node $N_1$. In the described example, resistor 224 has a resistance of about 100 Kilo-Ohms, and transistor 216 has a gate width of about 5 microns.

The battery supply voltage $V_{DD}$ biases current source 205 such that a current $I_1$ flows through transistor 216. Resistor 224 ensures that transistor 216 operates in a saturated mode. The relatively large value of resistor 224 limits current to the gate of transistor 216. As a result, current source 205 provides a relatively constant current $I_1$ regardless of the semiconductor manufacturing process used to produce current source 205. $I_1$ is set by the Imax distribution of the semiconductor manufacturing process used to produce transistor 216.

Bias circuit 201 further includes transistor 218. The drain of transistor 218 is also coupled to receive the battery supply voltage $V_{DD}$ from node $N_0$. In the described example, transistor 218 has a width of about 120 microns. The gate of transistor 218 is coupled with node $N_1$, and the source of transistor 218 is coupled with output node $N_2$. The voltage on node $N_1$ (hereinafter $V_{N1}$) is sufficient to turn on transistor 218, such that a current $I_3$ flows through transistor 218.

Bias circuit 201 further includes transistor 217. The drain of transistor 217 is coupled with node $N_1$, the gate of transistor 217 is coupled with output node $N_2$, and the source of transistor 217 is coupled with ground. In the described example, transistor 217 has a width of about 350 microns. The voltage $V_{N1}$ on node $N_1$, and the voltage on output node $N_2$ (hereinafter $V_{N2}$) are sufficient to turn on transistor 217, such that a current $I_2$ flows through transistor 217. Output node $N_2$ is coupled with the gate of RF amplifier transistor 220 through resistor 226. In the described example, resistor 226 has a resistance of about 1000 Ohms.

Transistor 217 and RF amplifier transistor 220 are connected in a current mirror configuration. As a result, the current density through transistor 217 is equal to the current density through RF amplifier transistor 220. In the described example, the ratio of the widths of transistors 217 and 220 is about 1:20 (i.e., 350:7000). Consequently, the ratio of currents $I_2$ and $I_O$ will be about 1:20.

Bias circuit 201 further includes current load 206. Current load 206 is coupled with output node $N_2$. More specifically, output node $N_2$ is coupled with a first terminal of resistor 225 and to the drain of transistor 219. The second terminal of resistor 225 is coupled with the gate of transistor 219. The source of transistor 219 is coupled with ground. In the described example, resistor 225 has a resistance of about 45 Kilo-Ohms, and transistor 219 has a gate width of about 4 microns.

The voltage $V_{N2}$ on output node $N_2$ biases transistor 219, such that a current $I_4$ flows through transistor 219. Resistor 225 ensures that transistor 219 operates in a saturated mode. The relatively large value of resistor 225 limits current to the gate of transistor 219. As a result, current load 206 provides a relatively constant current $I_4$ regardless of the semiconductor manufacturing process used to produce current load 206. This aids in maintaining a low output impedance at output node $N_2$. Because the width of transistor 216 is greater than the width of transistor 219, the current $I_1$ provided by current source 205 is greater than the current $I_4$ drawn by current load 206.

Ignoring for the moment the effects provided by voltage compensation circuit 202, temperature compensation circuit 203 and mode select circuit 204, the operation of bias circuit 201 will now be described. For the above-described configuration of bias circuit 201, the quiescent DC bias current $I_O$ through RF amplifier transistor 220 will have a particular value in response to the battery supply voltage $V_{DD}$. If the battery supply voltage $V_{DD}$ increases, the currents $I_1$ and $I_4$ will increase slightly. At voltages between about 2.0 Volts to 5.0 Volts, the quiescent DC bias current $I_O$ varies linearly at a rate of about 22.5 milliAmperes/Volt (mA/V).

Figure 1A:
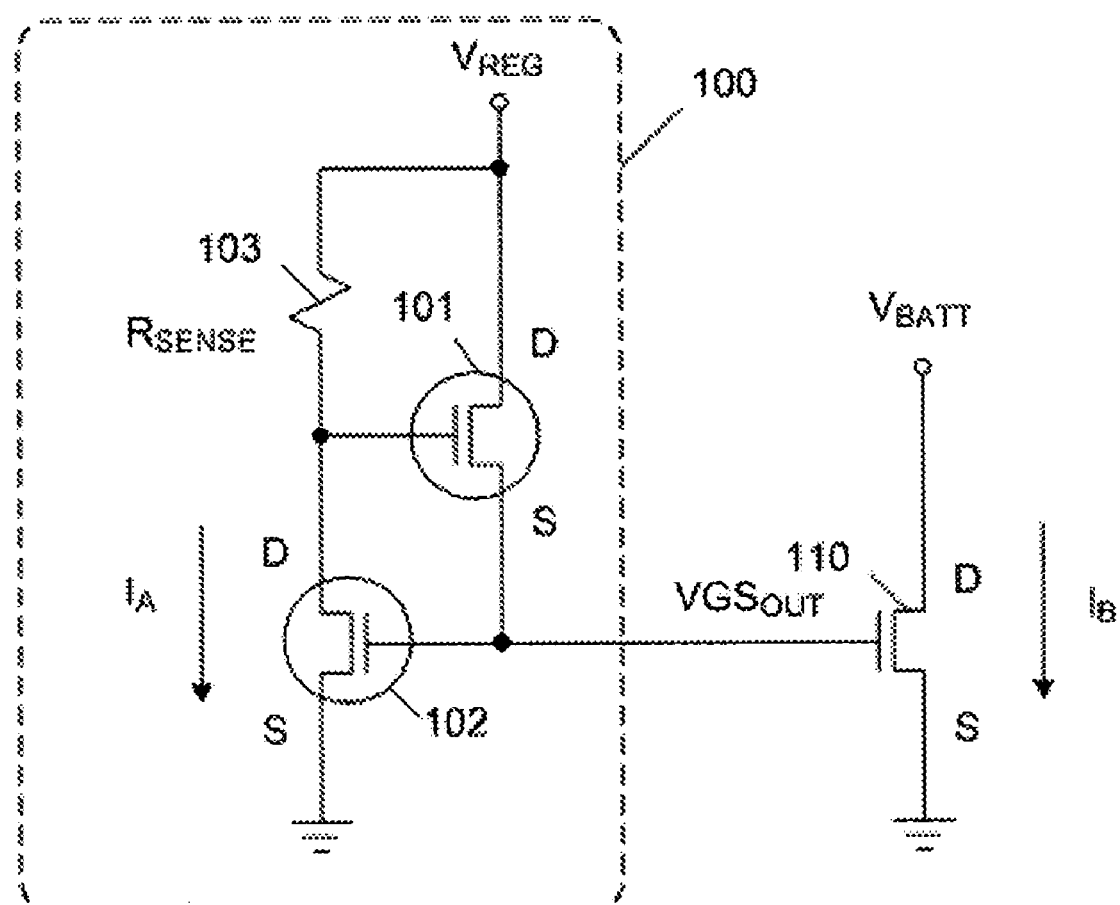
FIG. 1A is a circuit diagram of a conventional bias circuit associated with a linear power amplifier.
Figure 1B:
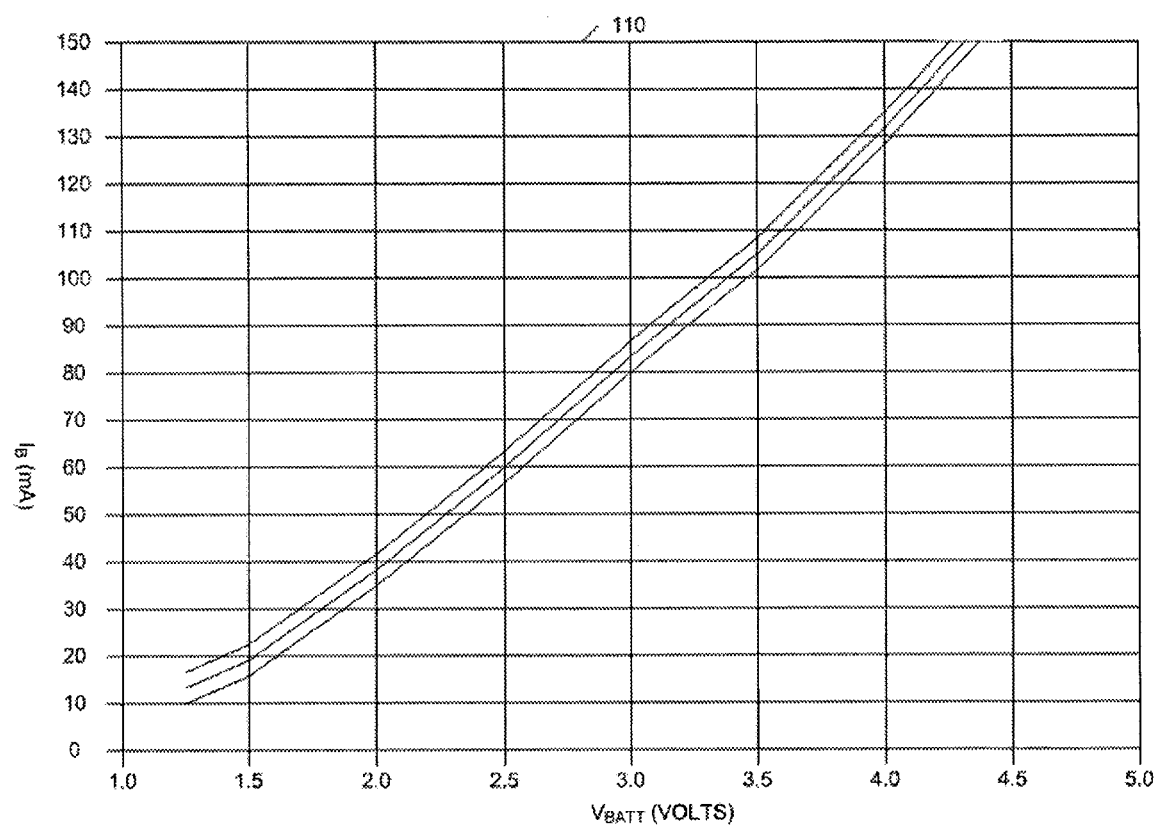
FIG. 1B is a graph that illustrates the manner in which the quiescent DC bias current of the bias circuit of FIG. 1A changes in response to changes in battery voltage.
Figure 3:
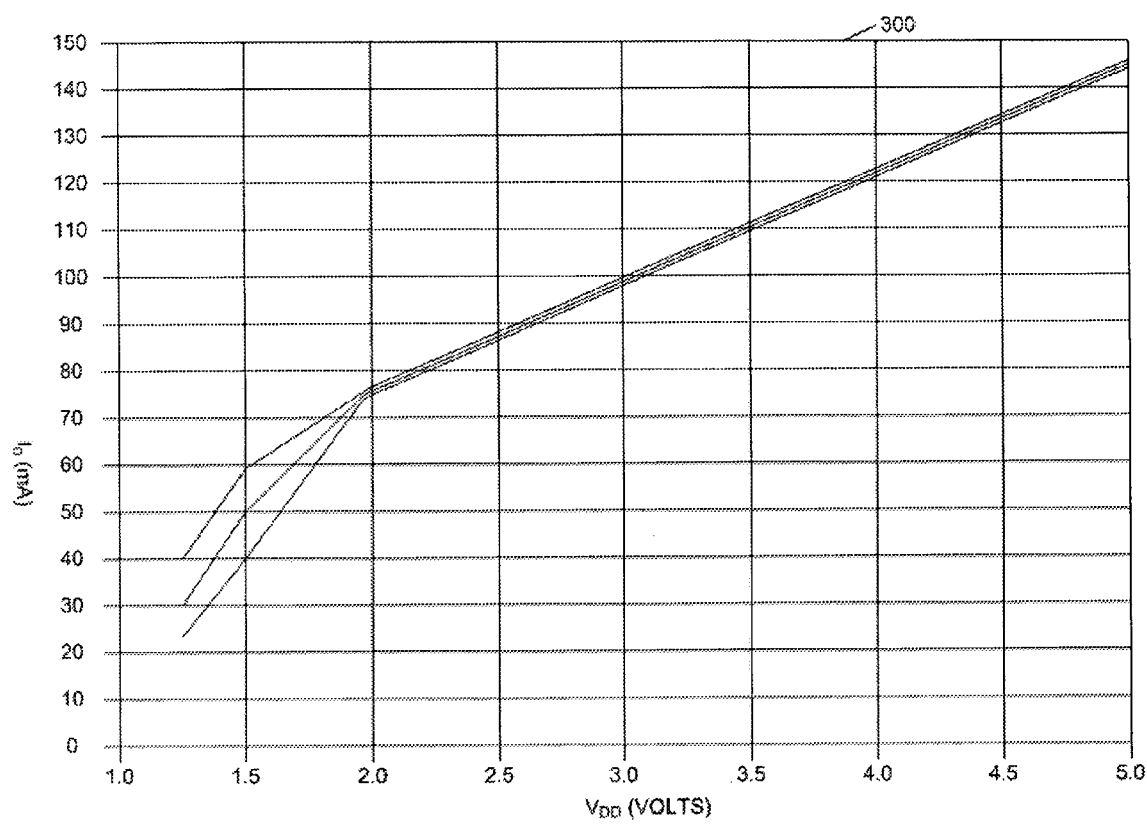
FIG. 3 is a graph illustrating the change in quiescent DC bias current with respect to changes in the battery supply voltage, in accordance with one embodiment of the present invention.

FIG. 3 is a graph 300 illustrating the change in quiescent DC bias current $I_O$ with respect to changes in the battery supply voltage $V_{DD}$. Note that current source 205 and current load 206 result in an improved linear variation, when compared to the non-linear variation illustrated by FIG. 1B. As described above, graph 300 does not take into account the effects of voltage compensation circuit 202, temperature compensation circuit 203 or mode select circuit 204.

The operation of voltage compensation circuit 202 will now be described. Voltage compensation circuit 202 includes resistor 221 and transistors 210–212. The first terminal of resistor 221 and the drain of transistor 210 are coupled to receive the battery supply voltage $V_{DD}$ from node $N_0$. The second terminal of resistor 221 is coupled with the gate of transistor 210 and to the drain of transistor 211. The source of transistor 210 is coupled with the gates of transistors 211 and 212. The sources of transistors 211 and 212 are coupled with ground. The drain of transistor 212 is coupled with node $N_1$. In the described example, resistor 221 has a resistance of about 2000 Ohms, and transistors 210, 211 and 212 have widths of about 12 microns, 4 microns and 6 microns, respectively.

The battery supply voltage $V_{DD}$ is sufficient to turn on transistor 210, thereby applying a bias voltage $V_{N3}$ to the gates of transistors 211 and 212. Transistors 211 and 212 are connected in a current mirror configuration, such that the current density through transistor 211 is equal to the current density through transistor 212. Because the ratio of the widths of transistors 211 and 212 is about 2:3 (i.e., 4:6), the ratio of current $I_5$ to current $I_6$ will be about 2:3.

As the battery supply voltage $V_{DD}$ increases, the bias voltage $V_{N3}$ increases, and the currents $I_5$ and $I_6$ through transistors 211 and 212 will increase. As the current $I_6$ increases, the current $I_2$ decreases. Note that applying Kirchoff's Current Law to node $N_1$ yields $I_1=I_2+I_6+I_7+I_8$. Thus, as current $I_6$ increases, current $I_2$ must decrease by an equal amount (assuming that currents $I_1$, $I_7$ and $I_8$ remain constant). As the current $I_2$ decreases, the quiescent DC bias current $I_O$ through RF amplifier transistor 220 decreases. Thus, voltage compensation circuit 202 tends to reduce the quiescent DC bias current $I_O$ as the battery supply voltage $V_{DD}$ increases.

As illustrated above in connection with FIG. 3, in the absence of voltage compensation circuit 202, the quiescent DC bias current $I_O$ through RF amplifier transistor 220 increases as the battery supply voltage $V_{DD}$ increases. However, as described above, voltage compensation circuit 202 tends to reduce the quiescent DC bias current $I_O$ as the battery supply voltage $V_{DD}$ increases. The net result is that the quiescent DC bias current $I_O$ remains relatively constant for variations of the battery supply voltage $V_{DD}$. The various circuit elements are selected such that the overall change in the quiescent DC bias current $I_O$ is minimized for fluctuations in the battery supply voltage $V_{DD}$.

Figure 4:
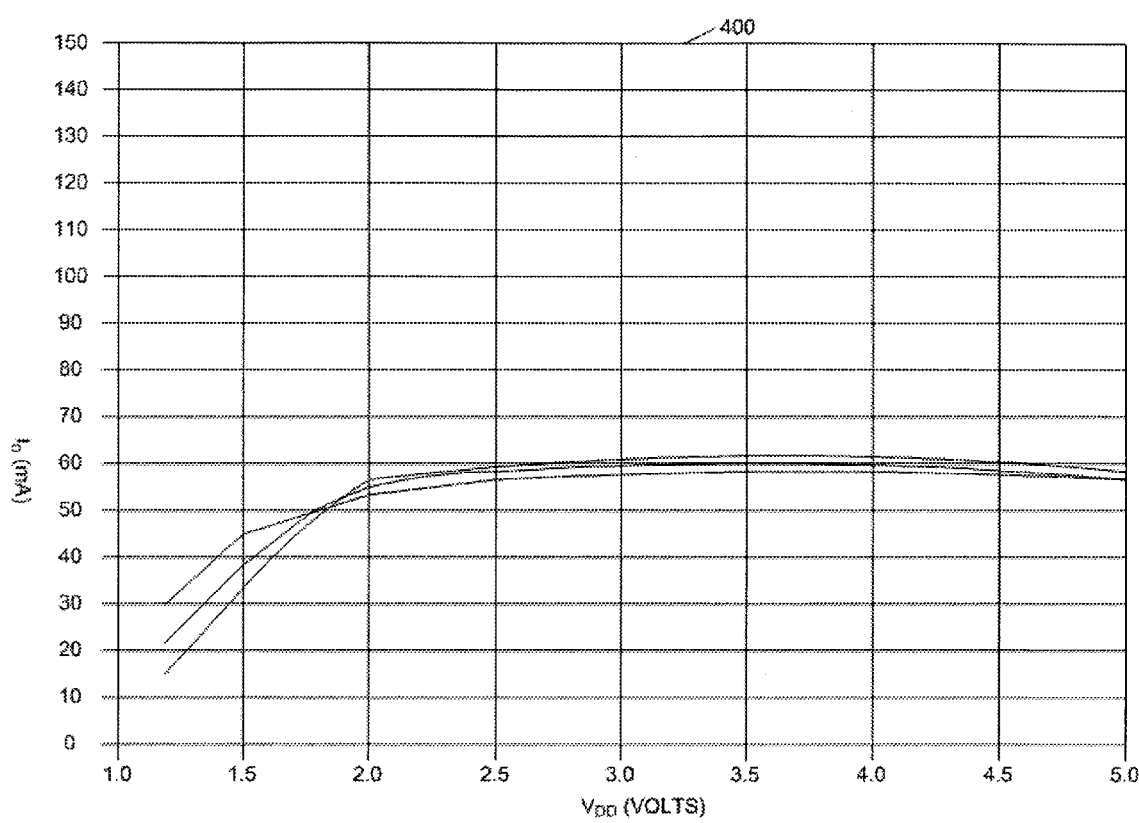
FIG. 4 is a graph illustrating the change in quiescent DC bias current with respect to changes in the battery voltage supply, when taking into account the effects of a voltage compensation circuit.

FIG. 4 is a graph 400 illustrating the change in quiescent DC bias current $I_O$ with respect to changes in the battery supply voltage $V_{DD}$, when taking into account the effects of voltage compensation circuit 202. Note that the quiescent DC bias current $I_O$ is substantially constant for battery voltages between 2 and 5 Volts.

The operation of temperature compensation circuit 203 will now be described. Temperature compensation circuit 203 includes resistor 222, transistor 213 and diode element 240. The first terminal of resistor 222 and the drain of transistor 213 are coupled with node $N_1$. The second terminal of resistor 222 is coupled with the gate of transistor 213. The source of transistor 213 is coupled with the anode of diode element 240. The cathode of diode element 240 is coupled with ground. In the described example, resistor 222 has a resistance of about 45 Kilo-Ohms, transistor 213 has a width of about 10 microns, and diode element 240 has a width of about 2 microns.

The voltage $V_{N1}$ on node $N_1$ is sufficient to cause a current $I_7$ to flow through transistor 213. As the temperature of bias system 200 increases, the resistance associated with transistor 213 increases. In response, the current $I_7$ through transistor 213 decreases. As the current $I_7$ decreases, the current $I_2$ increases, again, assuming $I_1$, $I_6$ and $I_9$, remain constant, since $I_1=I_2+I_6+I_7+I_8$. As the current $I_2$ increases, the quiescent DC bias current $I_O$ through RF amplifier transistor 220 increases. Thus, temperature compensation circuit 203 tends to increase the quiescent DC bias current $I_O$ as the temperature increases.

In the absence of temperature compensation circuit 203, the quiescent DC bias current $I_O$ through RF amplifier transistor 220 will decrease as the temperature increases. More specifically, the increase in temperature causes the transconductance of RF amplifier transistor 220 to decrease, thereby resulting in a decrease in the current $I_O$ through transistor 220. Thus, as the temperature increases, bias circuit 201 tends to reduce the quiescent DC bias current $I_O$, while temperature compensation circuit 203 tends to increase the quiescent DC bias current $I_O$. The net result is that the quiescent DC bias current $I_O$ is relatively constant with respect to changes in temperature. The various circuit elements are sized such that the overall change in the quiescent DC bias current $I_O$ is minimized for fluctuations in temperature.

Figure 5:
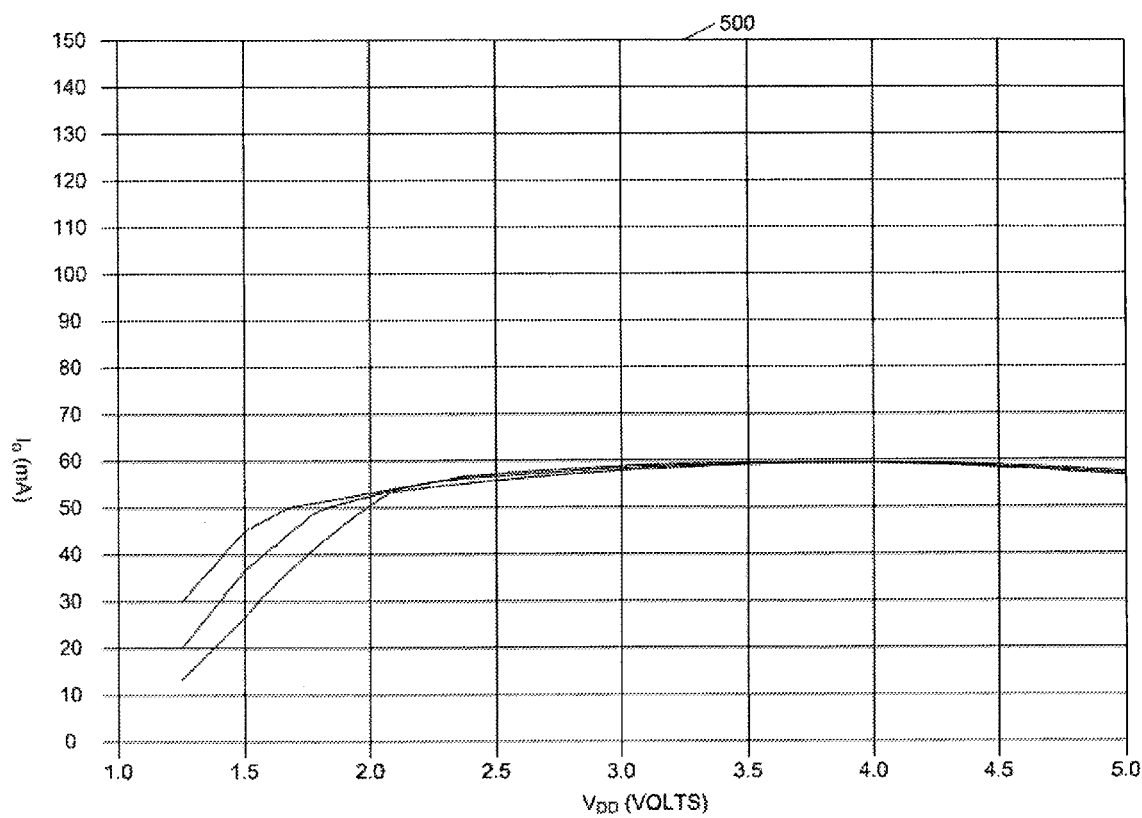
FIG. 5 is a graph illustrating the change in quiescent DC bias current with respect to changes in the battery voltage supply, when taking into account the effects of both a voltage compensation circuit and a temperature compensation circuit.

FIG. 5 is a graph 500 illustrating the change in quiescent DC bias current $I_O$ with respect to changes in the battery supply voltage $V_{DD}$, when taking into account the effects of both voltage compensation circuit 202 and temperature compensation circuit 203. Note that the quiescent DC bias current $I_O$ is substantially constant for battery voltages between 2 and 5 Volts.

Figure 6:
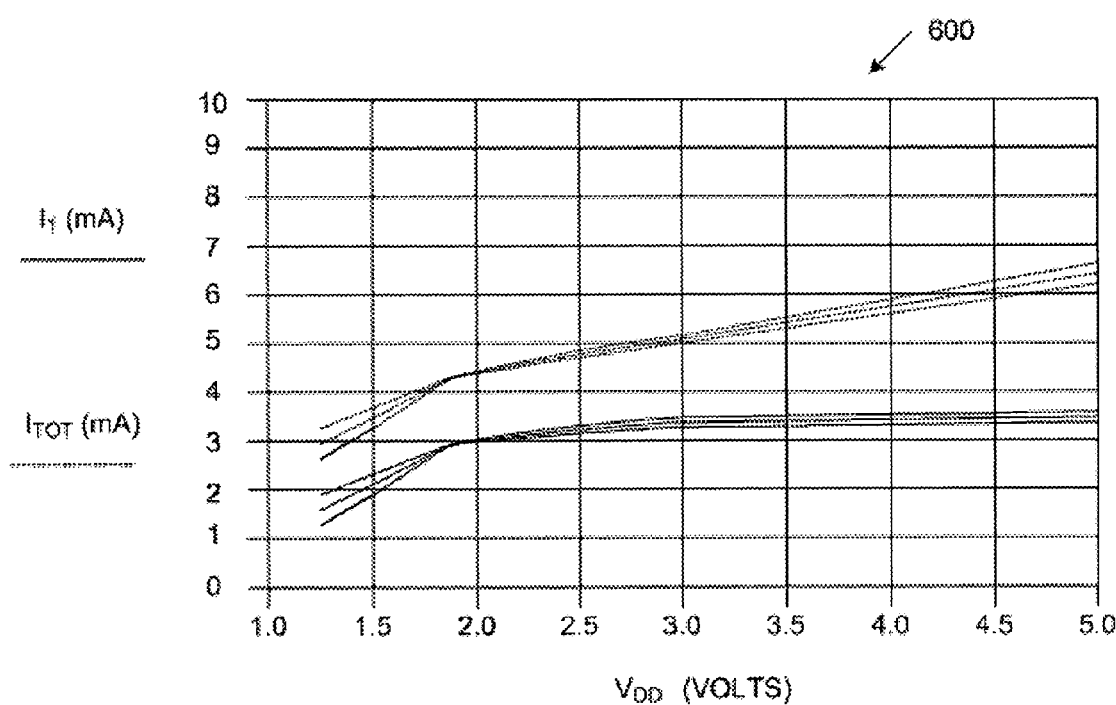
FIG. 6 is a graph that illustrates the manner in which various control currents vary in response to changes in the battery voltage supply, in accordance with one embodiment of the present invention.
Figure 7:
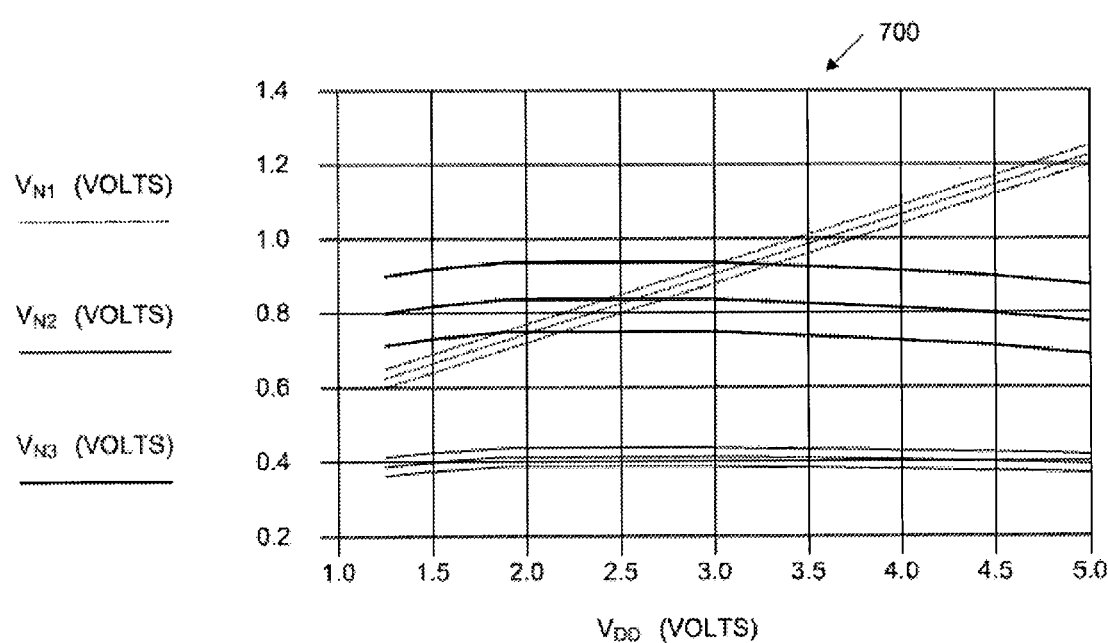
FIG. 7 is a graph that illustrates the manner in which the various control voltages vary in response changes in the battery voltage supply, in accordance with one embodiment of the present invention.

FIG. 6 and FIG. 7 further describe the operation of bias circuit 200. FIG. 6 is a graph 600 that illustrates the manner in which the current $I_1$ and the current $I_{TOT}$ vary in response to changes in the battery supply voltage $V_{DD}$. FIG. 7 is a graph 700 that illustrates the manner in which the voltages $V_{N1}$, $V_{N2}$ and $V_{N3}$ vary in response changes in the battery supply voltage $V_{DD}$.

The operation of mode select circuit 204 will now be described. Mode select circuit 204 includes transistors 214–215, resistor 223 and control voltage signal 231. Control voltage signal 231 controls transistor 214 through resistor 223. A first terminal of resistor 223 is coupled with control voltage signal 231. The second terminal of resistor 223 is coupled with the gate of transistor 214. The drain of transistor 214 is coupled with node $N_1$, and the source of transistor 214 is coupled with the drain of transistor 215. The source of transistor 215 is coupled with ground, and the gate of transistor 215 is coupled with output node $N_2$. In the described example, resistor 223 has a resistance of about 10 Kilo-Ohms, and transistors 214 and 215 have widths of about 100 microns and 350 microns, respectively.

When the $V_{MODE}$ voltage provided by control voltage signal 231 is insufficient to turn on transistor 214, mode select circuit 204 is disabled, such that the current $I_8$ through transistors 214–215 is approximately zero. Stated another way, when disabled, mode select circuit 204 does not couple transistor 215 in parallel with transistor 217 between node $N_1$ and ground. As a result, system 200 operates in the manner described above in connection with FIGS. 2–5.

When the $V_{MODE}$ voltage provided by control voltage signal 231 is sufficient to turn on transistor 214, mode select circuit 204 is enabled. That is, mode select circuit 204 couples transistor 215 in parallel with transistor 217 between node $N_1$ and ground. This effectively increases the size of transistor 217. Under these conditions, a positive current $I_8$ flows through transistors 214 and 215, thereby effectively reducing the current density through transistor 217. As the current $I_8$ increases, the current $I_2$ decreases, again, assuming $I_1$, $I_6$ and $I_7$, remain constant, since $I_1=I_2+I_6+I_7+I_8$. As a result, the quiescent DC bias current $I_O$ through RF amplifier transistor 220 decreases.

Thus, mode select circuit 204, when enabled, reduces the quiescent DC bias current $I_O$. The reduction in current is determined by the ratio of the widths of transistor 215 to that of transistors 215 plus 217. In the present example, the widths of transistors 215 and 217 are each about 350 microns. Thus, when mode select circuit 204 is enabled, the effective width of transistor 217 is approximately doubled, and the current density through transistor 217 is reduced by approximately half. Consequently, the current density through RF amplifier transistor 220 is reduced by approximately half. In the foregoing manner, mode select circuit 204 advantageously provides a flexible manner for selecting between two quiescent DC bias currents.

Figure 8:
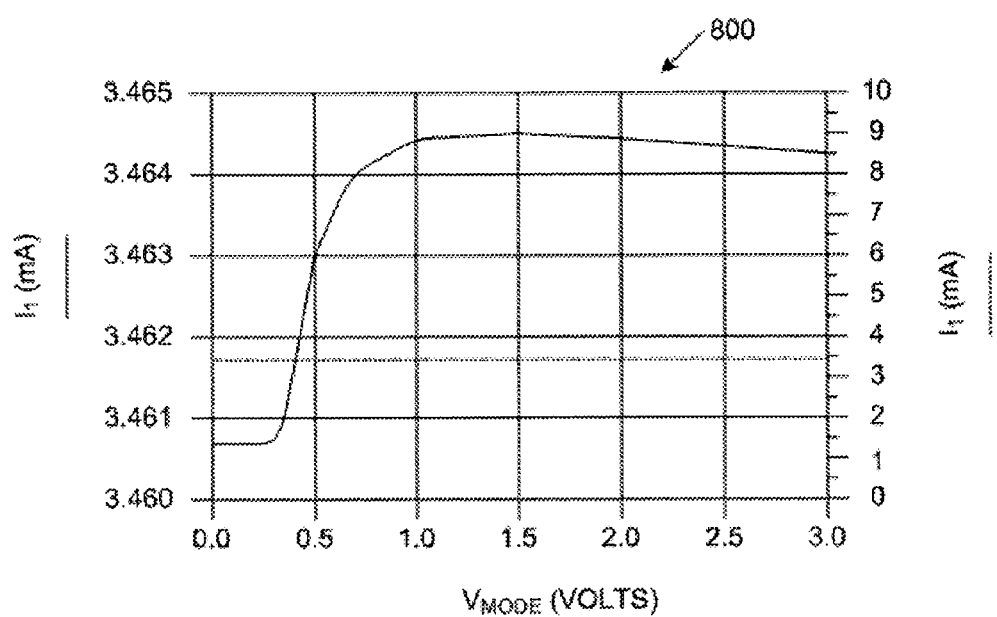
FIG. 8 is a graph that illustrates the manner in which a control current varies in response to a mode select signal, in accordance with one embodiment of the present invention.

FIG. 8 is a graph 800 that illustrates the manner in which the current $I_1$ varies in response to changes in the $V_{MODE}$ control voltage. Note that the current $I_1$ remains relatively unchanged as the $V_{MODE}$ control voltage varies from 0 to 3.0 Volts.

Figure 9:
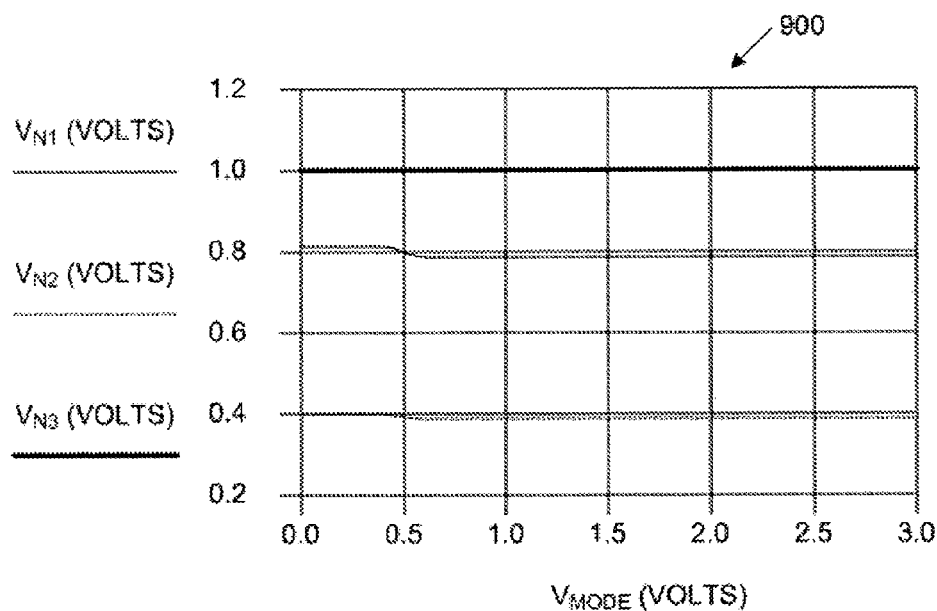
FIG. 9 is a graph that illustrates the manner in which various control voltages vary in response to the mode select signal, in accordance with one embodiment of the present invention.

FIG. 9 is a graph 900 that illustrates the manner in which the voltages $V_{N1}$, $V_{N2}$ and $V_{N3}$ vary in response to the $V_{MODE}$ control voltage. Note that the voltages $V_{N1}$, $V_{N2}$ and $V_{N3}$ remain relatively unchanged as the $V_{MODE}$ control voltage varies from 0 to 3.0 Volts.

Figure 10:
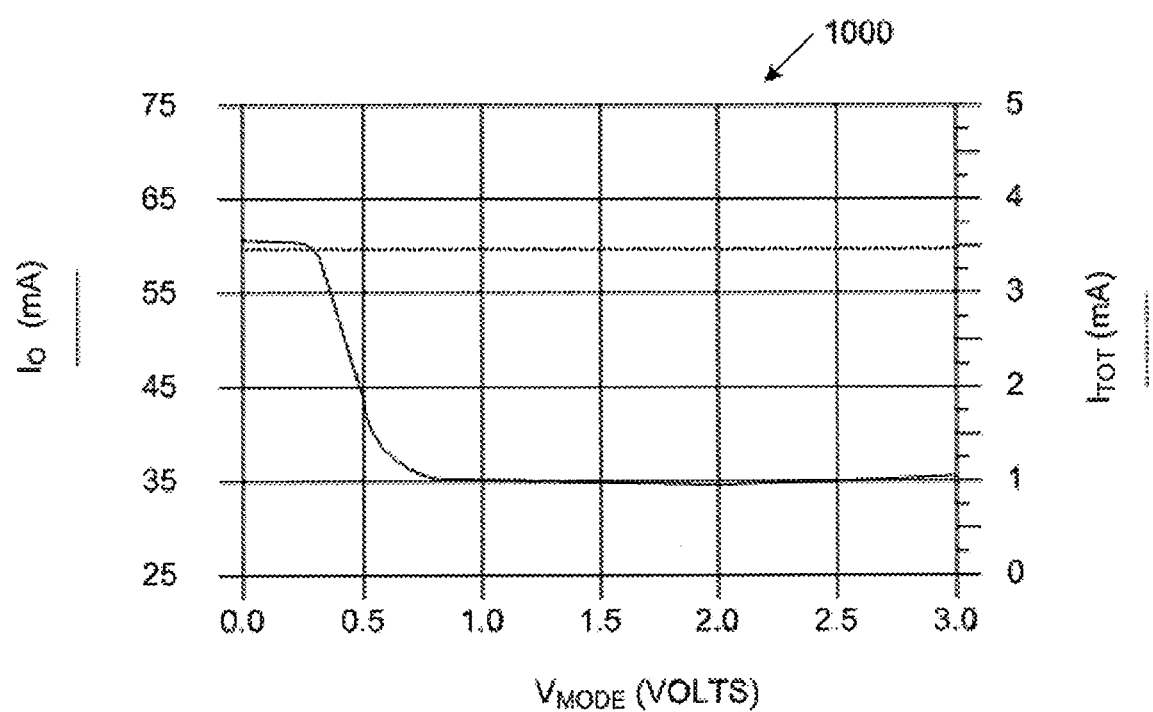
FIG. 10 is a graph that illustrates the manner in which the quiescent DC bias current varies in response to the mode select signal, in accordance with one embodiment of the present invention.

FIG. 10 is a graph 1000 that illustrates the manner in which the quiescent DC bias current 10 and the current $I_{TOT}$ vary in response to the $V_{MODE}$ control voltage. Note that the current $I_{TOT}$ remains relatively unchanged as the $V_{MODE}$ control voltage varies from 0 to 3.0 Volts, while the quiescent DC bias current $I_O$ varies from a high value of about 60 mA when $V_{MODE}$ is less than about 0.3 Volts, to a low value of about 35 mA, when $V_{MODE}$ is greater than about 0.8 Volts.

Although the invention has been described in connection with several embodiments, it is understood that this invention is not limited to the embodiments disclosed, but is capable of various modifications, which would be apparent to one of ordinary skill in the art. Thus, although the present invention has been described in connection with a single bias system 200 and a corresponding RF amplifier transistor 220, it is understood that multiple bias systems and RF amplifier transistors may be present in certain applications of the present invention (e.g., a multi-stage amplifier circuit).

Moreover, although the bias circuit of the present invention has been described in connection with linear RF power amplifiers, such as CDMA and WLAN devices, the bias circuit of the present invention can be used in other devices in other embodiments. Furthermore, although the present invention has been described in connection with circuit elements having particular sizes and conductivity types, it is understood that the present invention could be implemented using circuit elements of different sizes and conductivity types. In addition, although the mode select circuit 204 has been described as providing two possible quiescent DC bias currents $I_O$, it is understood that this mode select circuit 204 can be modified to provide additional quiescent DC bias currents by adding additional circuitry, which couples additional transistors in parallel with transistors 215 and 217 as the $V_{MODE}$ voltage varies. Thus, the invention is limited only by the following claims.

What is claimed is:

1. An amplifier bias system comprising:
   a battery voltage supply coupled with an amplifier transistor to be biased;
   an output node coupled with a gate of the amplifier transistor;
   a current source coupled with the battery voltage supply, wherein the current source provides a first current to a first node in response to the battery voltage supply and wherein the current source comprises:
   a current-sourcing transistor coupled between the battery voltage supply and the first node; and
   a resistor coupled between the battery voltane supply and a gate of the current-sourcing transistor;
   a first transistor coupled between the battery voltage supply and the output node, the first transistor having a gate coupled with the first node;
   a second transistor coupled with the first node, the second transistor having a gate coupled with the output node; and
   a current load coupled with the output node.

2. The amplifier bias system of claim 1, wherein the current load comprises:
   a current-sinking transistor coupled between the output node and ground; and
   a resistor coupled between the output node and a gate of the current-sinking transistor.

3. The amplifier bias system of claim 1, further comprising a filter circuit configured to isolate the amplifier transistor from the current source and the first transistor.

4. The amplifier bias system of claim 1, further comprising a voltage compensation circuit coupled with the battery voltage supply and the first node, wherein the voltage compensation circuit is configured to reduce a current flowing through the second transistor as a battery voltage provided by the battery voltage supply increases.

5. The amplifier bias system of claim 4, wherein the voltage compensation circuit comprises a current mirror circuit responsive to the battery voltage.

6. The amplifier bias system of claim 1, further comprising a temperature compensation circuit coupled with the first node, wherein the temperature compensation circuit is configured to increase a current flowing through the second transistor as a temperature of the amplifier bias system increases.

7. The amplifier bias system of claim 6, wherein the temperature compensation circuit comprises:
   a transistor having a drain coupled with the first node; a resistor coupled between the first node and a gate of the transistor; and
   a diode element coupled between a source of the transistor and ground.

8. The amplifier bias system of claim 4, further comprising a temperature compensation circuit coupled with the first node, wherein the temperature compensation circuit is configured to increase a current flowing through the second transistor as a temperature of the amplifier bias system increases.

9. The amplifier bias system of claim 1, further comprising a mode select circuit coupled with the first node and the output node, wherein the mode select circuit is configured to adjust a current flowing through the second transistor in response to a control voltage.

10. The amplifier bias system of claim 9, wherein the mode select circuit comprises:
    a first mode select transistor having a drain coupled with the first node; means for applying the control voltage to a gate of the first mode select transistor; and
    a second mode select transistor having a drain coupled with a source of the first mode select transistor, a source coupled with ground, and a gate coupled with the output node.

11. The amplifier bias system of claim 8, further comprising a mode select circuit coupled with the first node and the output node, wherein the mode select circuit is configured to adjust a current flowing through the second transistor in response to a control voltage.

12. A method of biasing an amplifier transistor comprising:
    generating a control current that varies linearly with respect to variations in a battery supply voltage;
    adjusting the control current in response to variations in the battery supply voltage;
    adjusting the control current in response to variations in temperature; and
    mirroring the control current to the amplifier transistor.

13. The method of claim 12, further comprising adjusting the control current in response to an adjustable control voltage.

* * * * *